United States Patent [19]
Freyman et al.

[11] Patent Number: 5,296,738
[45] Date of Patent: Mar. 22, 1994

[54] MOISTURE RELIEF FOR CHIP CARRIER

[75] Inventors: Bruce J. Freyman, Plantation; Frank J. Juskey, Coral Springs; Barry M. Miles, Plantation, all of Fla.

[73] Assignee: Motorola, Inc., Schaumburg, Ill.

[21] Appl. No.: 927,774

[22] Filed: Aug. 10, 1992

Related U.S. Application Data

[63] Continuation of Ser. No. 726,660, Jul. 8, 1991, abandoned.

[51] Int. Cl.⁵ .............................................. H01L 23/28
[52] U.S. Cl. ...................................... 257/684; 257/730
[58] Field of Search ...................... 357/70, 68, 72, 54, 357/55

[56] References Cited

U.S. PATENT DOCUMENTS

| | | | |
|---|---|---|---|
| 4,329,701 | 5/1982 | Brenneman | 357/72 |
| 4,760,440 | 7/1988 | Bigler et al. | 357/75 |
| 4,768,081 | 8/1988 | Moeller | 357/72 |
| 4,866,506 | 9/1989 | Nambu et al. | 357/72 |
| 4,942,452 | 7/1990 | Kitano et al. | 257/676 |

FOREIGN PATENT DOCUMENTS 0178153  8/1991  Japan .

*Primary Examiner*—Rolf Hille
*Assistant Examiner*—Roy Potter
*Attorney, Agent, or Firm*—Dale W. Dorinski; Pablo Meles

[57] ABSTRACT

An integrated circuit package (10) comprises a semiconductor die (14) having a top surface and a bottom surface, and a substrate (16) for receiving the semiconductor die. The substrate should have an aperture(s) (18) below the semiconductor die for providing moisture relief during temperature excursions. An adhesive (20) applied to the substrate allows for mounting the semiconductor die to the substrate. Then, the semiconductor die is wirebonded to the substrate. Finally, an encapsulant (12) for sealing the top surface of the semiconductor die is formed over the semiconductor die and portions of the substrate.

12 Claims, 5 Drawing Sheets

MOISTURE RELIEF FOR CHIP CARRIER

This is a continuation of application Ser. No. 07/726,660, filed Jul. 8, 1991, and now abandoned.

TECHNICAL FIELD

This invention relates to printed circuit board chip carriers, and more particularly to overmolded and glob top chip carriers that allow for moisture relief.

BACKGROUND OF THE INVENTION

Over Molded Carriers such as the Over Molded Pad Array Carrier (OMPAC), the Over Molded Peripheral Chip Carrier (OMPCC), and the Over Molded Pin Grid Array (OMPGA) and their equivalent glob top printed circuit board chip carriers are susceptible to moisture during manufacturing. These integrated circuit packages suffer from "Popcorning" when subjected to heat. This problem is particularly noticeable in surface mount packages using printed circuit boards, which experience higher thermal and mechanical stresses due to the exposure of the entire package to solder reflow temperatures. Typically, these integrated circuit packages are baked prior to solder assembly to remove moisture. Moisture usually penetrates the over mold top or glob top, the substrate, the die or integrated circuit residing between the over mold top or glob top and the substrate, and especially the adhesive used to attach the die to the substrate. The die attach adhesive is usually a hygroscopic material. Exposure of the package to solder reflow temperatures after the die attach adhesive absorbs moisture, causes the rapid expansion of the moisture into water vapor. This causes the die to delaminate from the substrate. Thus the "popcorn" effect.

U.S. Pat. No. 4,866,506 by Nambu Et. Al. discusses a flat plastic-sealed IC device and lead frame in a package that has an opening in the back surface of the package, allowing exposure to the atmosphere and the release of moisture when subjected to heat. This package, also known as the Quad Flat Pack (QFP), is easily manufactured, but leaves the bottom surface of the lead frame exposed to the atmosphere. The QFP does not use a substrate or printed circuit board as in OMPAC, OMPCC, and OMPGA and their glob top equivalents; thus, a different solution is required. The present invention provides a means for releasing moisture in a completely different structure.

SUMMARY OF THE INVENTION

An integrated circuit package comprises a semiconductor die having a top surface and a bottom surface, and a substrate for receiving the semiconductor die. The substrate should have an aperture(s) below the semiconductor die. An adhesive applied to the substrate allows for mounting the semiconductor die to the substrate. Then, an over molded encapsulant or a glob top for sealing the top surface of the semiconductor die is formed over the semiconductor die and portions of the substrate.

DESCRIPTION OF THE PREFERRED EMBODIMENT

Figure 1:
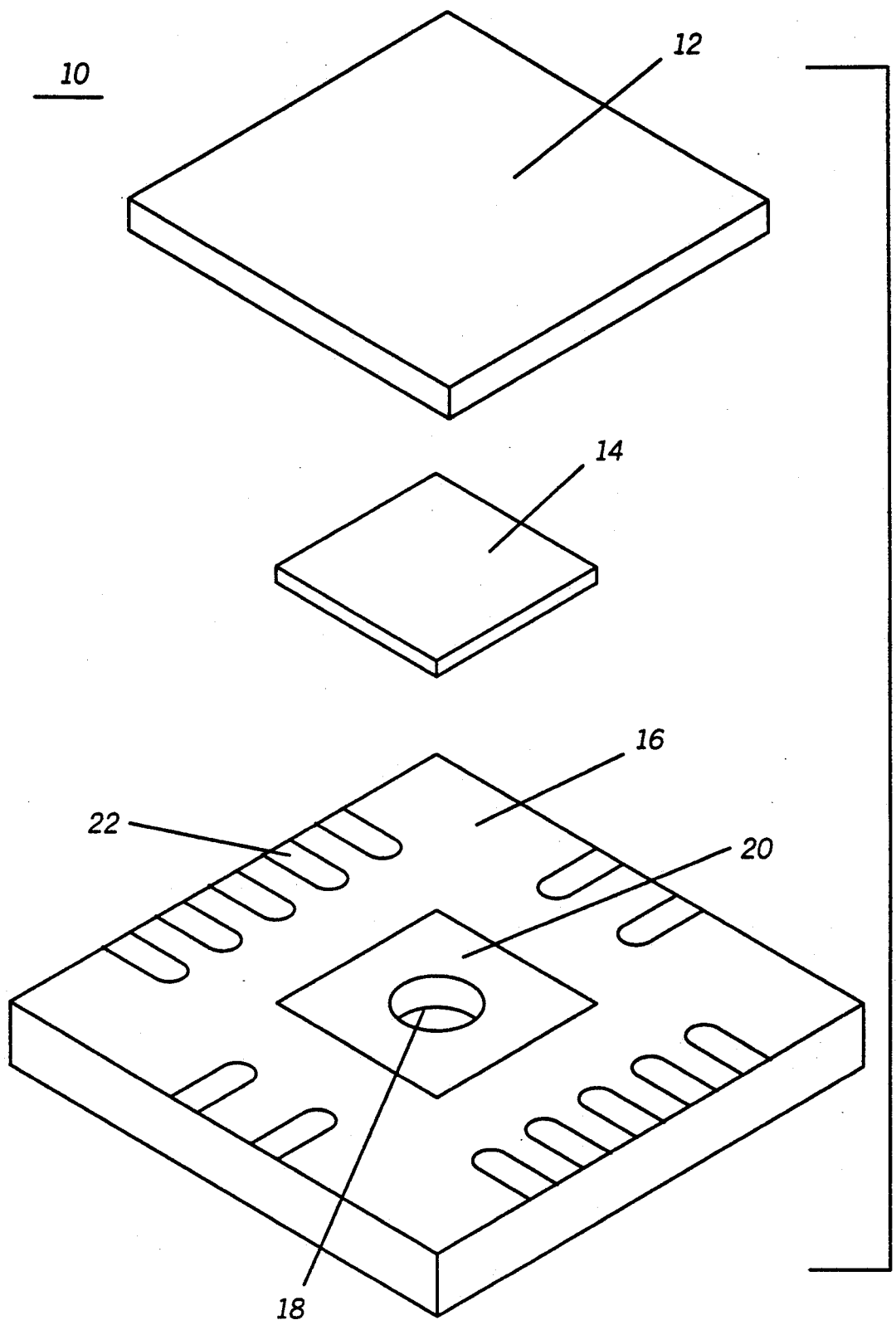
FIG. 1 is an exploded peripheral view of an overmolded chip carrier in accordance with the present invention.

Referring to FIG. 1, there is shown a chip carrier 10 in accordance with the present invention. Preferably, the chip carrier is an overmolded pad array carrier, an overmolded pin grid array, an overmolded peripheral chip carrier, or alternatively, a glob top pad array carrier, a glob top pin grid array, or a glob top peripheral chip carrier. Essentially, the present invention is applicable to any printed circuit board chip carrier having integrated circuits and an encapsulant such as an over mold or glob top. Typically, a substrate 16 for receiving a semiconductor die 14 has printed circuitry 22 on the substrate 16. A hole(s) or aperture(s) 18 is arranged and constructed so as to reside below the semiconductor die 14. The hole 18 is preferably small enough (less than a 30 mil diameter) not to alter the design of the solder connections on the bottom of the package. Then a die attach adhesive 20 such as a bisphenol-epichlorhydrin based epoxy which is preferably filled with silver is applied in the die attach region. The adhesive is preferably dispensed onto the substrate, although other means of applying the adhesive is within contemplation of the present invention. Once the die 14 is attached to the substrate 16 (via the adhesive 20), the adhesive is cured by using heat. The hole 18 is usually partially filled with the adhesive after curing. The partially filled hole prevents mechanical damage to the die back plane, but allows water vapor to be expunged during temperature excursions such as during reflow soldering. After wire bonding, an overmolded compound 12 is applied over the die and portions of the substrate 16 forming the overmolded peripheral chip carrier 10 shown in FIG. 1.

Figure 2:
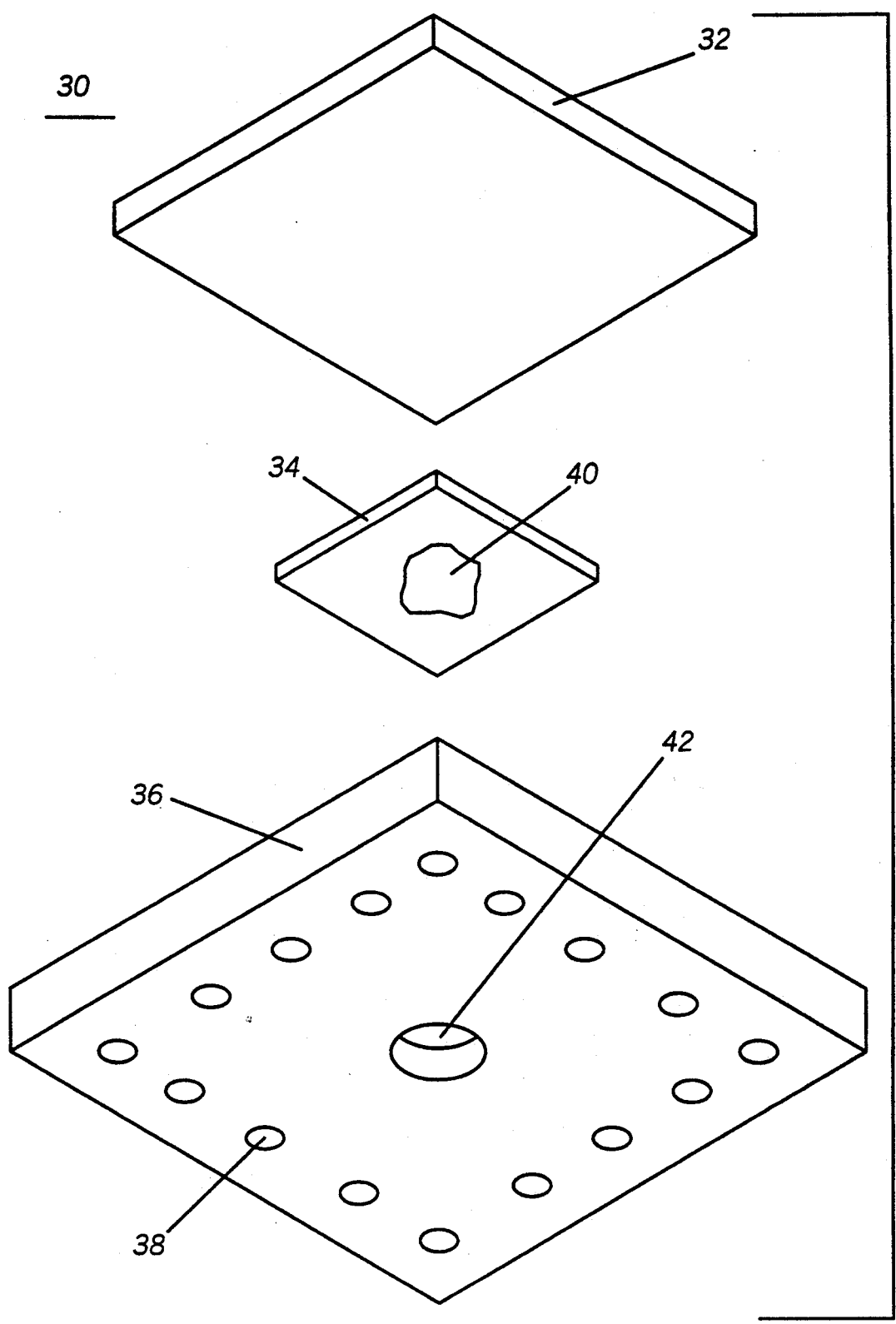
FIG. 2 is an exploded peripheral view of a overmolded pad array carrier in accordance with the present invention.

Referring to FIG. 2, there is shown another overmolded chip carrier 30 in accordance with the present invention. This overmolded pad array carrier 30 further includes solder pads 38 on the bottom portion of a substrate 36 for receiving a semiconductor die 34 that has printed circuitry (not shown). A hole(s) or aperture(s) 42 is arranged and constructed so as to reside below the semiconductor die 34. The hole 42 is preferably small enough (less than a 30 mil diameter) not to alter the design of a solder bumped pad array on the bottom of a package as shown. Then a die attach adhesive 40 is applied either to the bottom of the die 34 or the top surface of the substrate 36. The adhesive 40 is preferably dispensed or screened onto the substrate 36, although other means of applying the adhesive is within contemplation of the present invention. Then an overmolded compound 32 is formed over the die and portions of the substrate 36.

Figure 3:
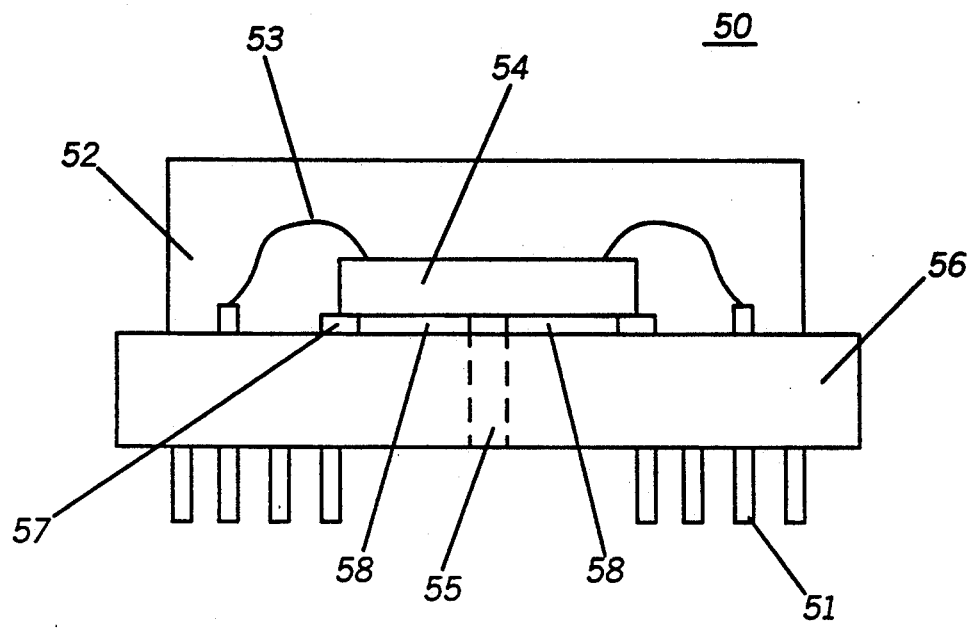
FIG. 3 is a cut view of overmolded pin grid array in accordance with the present invention.

Referring to FIG. 3, there is shown a cut view of an overmolded pin grid array (OMPGA) 50. The OMPGA is formed essentially as described above in FIG. 2, with the addition of pins 51 protruding from the bottom of the package. The OMPGA 50 comprises a substrate 56 having at least one aperture 55 residing below a semiconductor die 54. The back plane of the die 54 is attached to the substrate 56 via an adhesive 58. Some of the conductive runners 57 on the substrate 56 are coupled to the die 54 via a wirebond 53. Once the die is wirebonded, then an overmold 52 is formed above the substrate and die.

Figure 4:
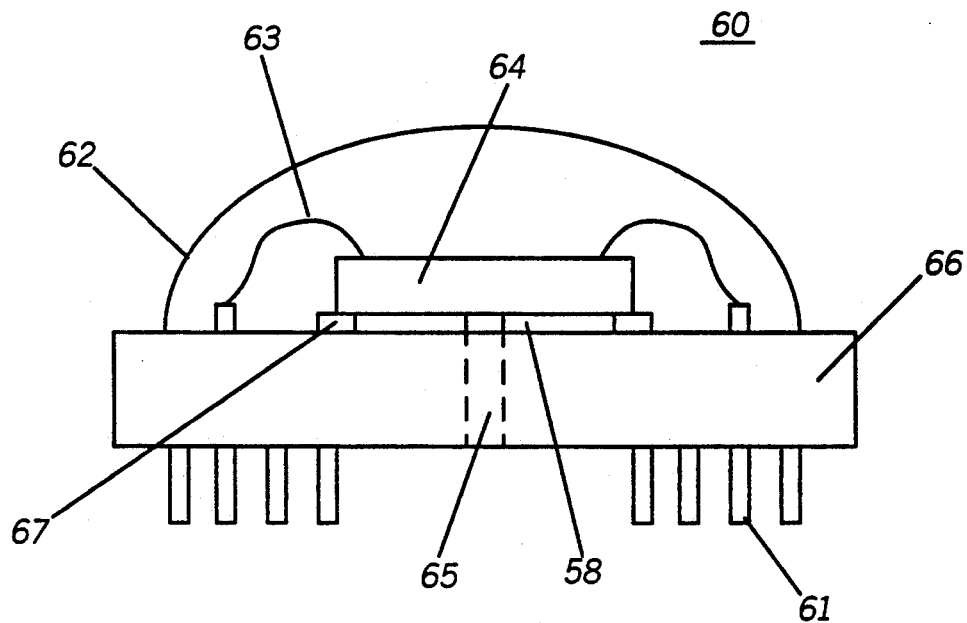
FIG. 4 is a cut view of a glob top pin grid array in accordance with the present invention.

Referring to FIG. 4, there is shown a cut view of an glob top pin grid array 60. The device 60 is formed essentially as described above in FIG. 2, with the addition of pins 61 protruding from the bottom of the package and a glob top instead of an overmold. The device 60 comprises a substrate 66 having at least one aperture 65 residing below a semiconductor die 64. The back plane of the die 64 is attached to the substrate 66 via an adhesive 58. Some of the conductive runners 67 on the substrate 66 are coupled to the die 64 via a wirebond 63. Once the die is wirebonded, then an glob top 62 is formed above the substrate and die.

Figure 5:
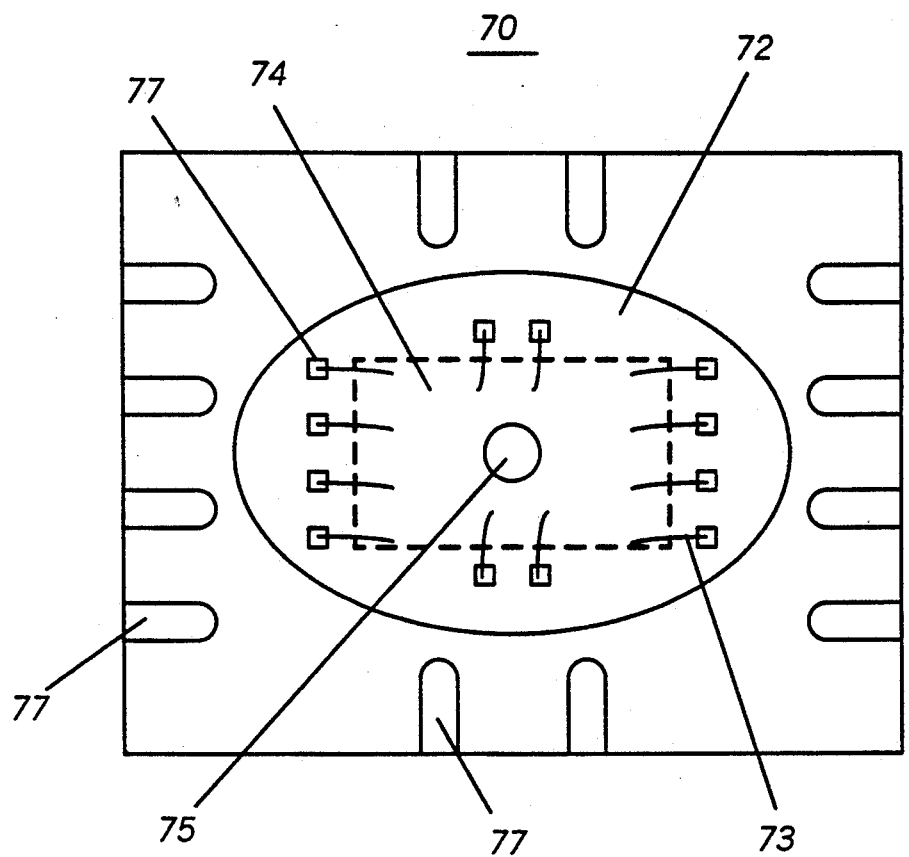
FIG. 5 is a top plan view of a glob top peripheral chip carrier in accordance with the present invention.

Referring to FIG. 5, there is shown a top plan view of an glob top peripheral chip carrier 70. The device 70 is formed essentially as described above in FIG. 1, with a glob top instead of an overmold. The device 70 comprises a substrate 76 having at least one aperture 75 residing below a semiconductor die 74. The back plane of the die 74 is attached to the substrate 76 via an adhesive (not shown). Some of the conductive runners 77 on the substrate 76 are coupled to the die 74 via a wirebond 73. Once the die is wirebonded, then a glob top 72 is formed above the substrate and die.

Figure 6:
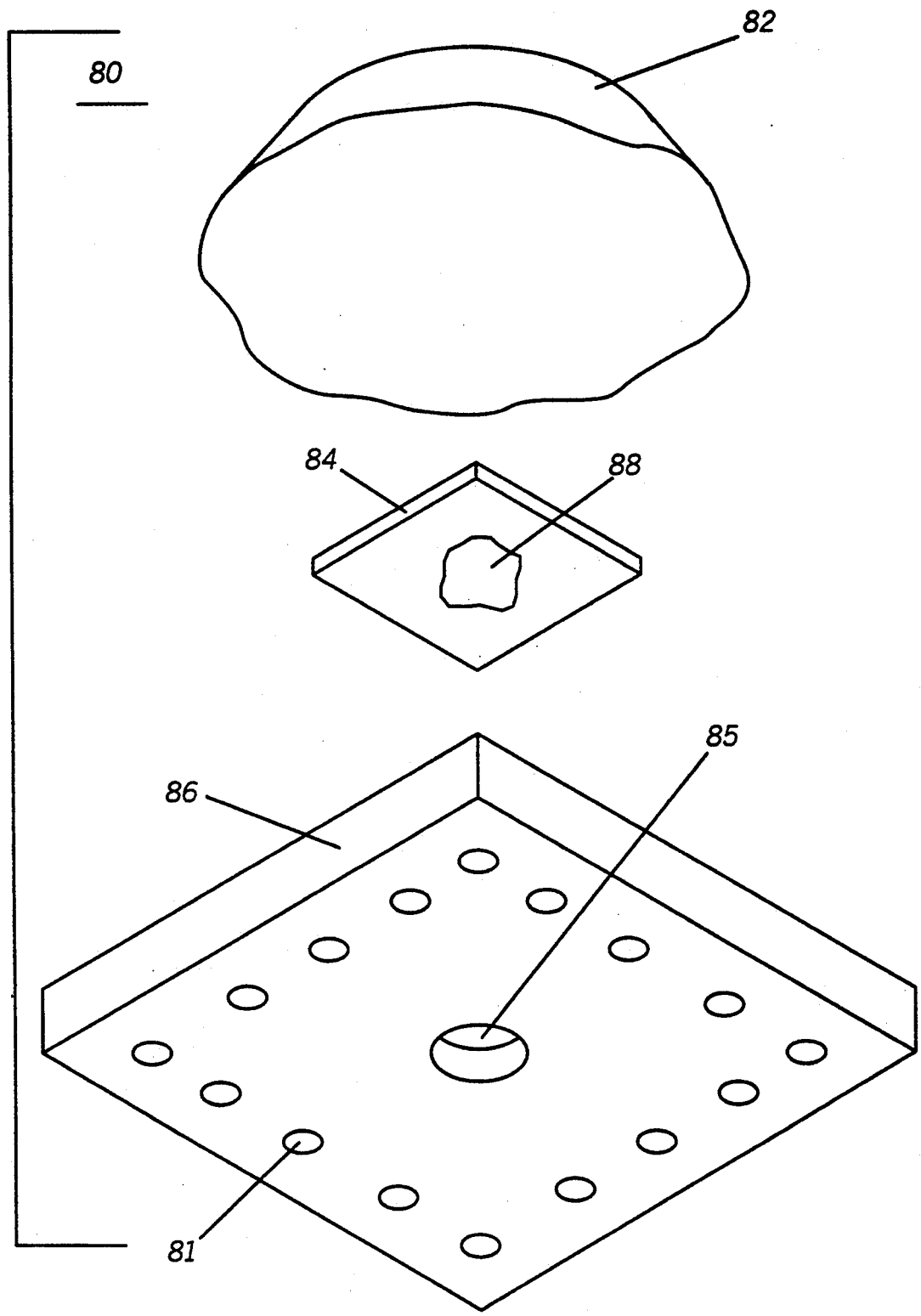
FIG. 6 is an exploded peripheral view of a glob top pad array carrier in accordance with the present invention.

Referring to FIG. 6, there is shown an exploded peripheral view of an glob top pad array carrier 80. The device 80 is formed essentially as described above in FIG. 2, with a glob top instead of an overmold. The device 80 comprises a substrate 86 having at least one aperture 85 residing below a semiconductor die 84. The substrate 86 further comprises several solder pads 81 on the bottom surface of the substrate 86. The back plane of the die 84 is attached to the substrate 86 via an adhesive 88. Once the die is wirebonded, then a glob top 82 is formed above the substrate and die.

We claim as our invention:

1. An overmolded pad array chip carrier package, comprising:
    a semiconductor die;
    a printed circuit board substrate for receiving said semiconductor die, said printed circuit board substrate having first and second opposed major surfaces and said substrate having at least one hole below said die;
    an adhesive applied to said printed circuit board substrate for mounting said semiconductor die to said printed circuit board substrate, at least a portion of said adhesive filling at least a portion of said hole;
    at least one wirebond from said printed circuit board substrate to said semiconductor die;
    an overmolded epoxy cover encapsulating said semiconductor die, said at least one wirebond, and portions of said printed circuit board substrate first surface so as to expose said portion of said adhesive to an environment.

2. The chip carrier package of claim 1, wherein said at least one hole is less than 30 mils in diameter.

3. An integrated circuit package, comprising:
    a semiconductor die having a top surface and a bottom surface;
    a printed circuit substrate for receiving said semiconductor die, said printed circuit substrate having a die mounting area with a hole extending through the printed circuit substrate;
    an adhesive applied to the printed circuit substrate for mounting said semiconductor die to said printed circuit substrate, a portion of said adhesive at least partially filling said hole;
    at least one wirebond from said printed circuit substrate to said semiconductor die,
    a glob top encapsulant for sealing the top surface of said semiconductor die, said wirebonds and only an upper surface of said printed circuit substrate.

4. The integrated circuit package of claim 3, wherein said integrated circuit package comprises a glob top pad array carrier.

5. The integrated circuit package of claim 3, wherein said integrated circuit package comprises a glob top pin grid array.

6. The integrated circuit package of claim 3, wherein said integrated circuit package comprises a glob top peripheral chip carrier.

7. The integrated circuit package of claim 3, wherein said adhesive comprises a bisphenol-epichlorhydrin based epoxy.

8. The integrated circuit package of claim 3, wherein said hole(s) is less than 30 mils in diameter.

9. A chip carrier package, comprising:
    a semiconductor die having a perimeter;
    a printed circuit board for receiving said semiconductor die, said printed circuit board having first and second opposed major surfaces and having at least one hole within an area bounded by said semiconductor die perimeter;
    an adhesive applied to said first major surface for mounting said semiconductor die to said printed circuit board, said adhesive filling at least a portion of said hole;
    at least one wirebond from said printed circuit board to said semiconductor die;
    an over molded cover encapsulating said semiconductor die, said at least one wirebond, portions of said printed circuit board first surface, and arranged so as to leave a portion of said hole in said second major surface exposed.

10. The chip carrier package of claim 1, wherein said chip carrier package comprises an over molded pad array carrier.

11. The chip carrier package of claim 1, wherein said chip carrier package comprises an over molded pin grid array.

12. The chip carrier package of claim 1, wherein said chip carrier package comprises an over molded peripheral chip carrier.

* * * * *